United States Patent [19]
Shioyama et al.

[11] Patent Number: 5,747,780
[45] Date of Patent: May 5, 1998

[54] APPARATUS FOR CONVEYING AND PROCESSING A WAFER IN A PHYSICALLY CONTACT-FREE STATE

[75] Inventors: Yoshiyuki Shioyama, Kawasaki; Masako Hori, Yokohama; Koji Kimura, Chigasaki, all of Japan

[73] Assignee: Kabushiki Kaisha Toshiba, Kawasaki, Japan

[21] Appl. No.: 600,639

[22] Filed: Feb. 13, 1996

[30] Foreign Application Priority Data

Feb. 14, 1995 [JP] Japan .................. 7-049092

[51] Int. Cl.⁶ .................................................. H05B 6/10
[52] U.S. Cl. ...................... 219/648; 219/635; 219/653; 414/222; 414/937; 414/938; 414/940; 118/719
[58] Field of Search .................................. 219/648, 653, 219/655, 656, 672, 635, 638; 414/222, 935, 940, 938, 937; 118/719

[56] References Cited

U.S. PATENT DOCUMENTS

| | | | |
|---|---|---|---|
| 3,363,081 | 1/1968 | Noiret | 219/648 |
| 4,531,037 | 7/1985 | Camus | 219/648 |
| 5,377,596 | 1/1995 | Ono et al. | 104/284 |
| 5,417,537 | 5/1995 | Miller | 414/217 |
| 5,443,346 | 8/1995 | Murata et al. | 414/222 |

FOREIGN PATENT DOCUMENTS

| | | |
|---|---|---|
| 03-272916 | 12/1991 | Japan . |
| 03-109863 | 4/1993 | Japan . |

*Primary Examiner*—Philip H. Leung
*Attorney, Agent, or Firm*—Finnegan, Henderson, Farabow, Garrett & Dunner, L.L.P.

[57] ABSTRACT

At the front side of a wafer cassette fitted to a wafer feeding unit of a magnetic levitation wafer conveying device, a wafer stopper for preventing the wafer waiting in the wafer cassette from popping out is provided. The wafer supplied from the magnetic levitation conveying device is supplied into the reaction chamber by magnetic force, and is directly held in the reaction chamber by this magnetic force. Since the wafer stopper is positioned between the wafer cassette fitted in the wafer feeding unit and the starting end of the wafer conveying route, the wafer waiting in the wafer cassette next to the wafer to be conveyed is prevented from popping out together with the wafer to be conveyed. Moreover, the wafer conveyed by the magnetic force can be directly held in the reaction chamber in heated state.

7 Claims, 5 Drawing Sheets

APPARATUS FOR CONVEYING AND PROCESSING A WAFER IN A PHYSICALLY CONTACT-FREE STATE

BACKGROUND OF THE INVENTIUON

1. Field of the Invention

The present invention relates to a semiconductor manufacturing apparatus comprising a feeding unit for supplying a wafer in a physically contact-free state, a conveying unit for conveying the wafer supplied from the feeding unit, and a reaction chamber for treating the wafer supplied from the conveying unit, and more particularly to a single wafer conveying device for convey wafer one by one.

2. Description of the Related Art

A semiconductor is manufactured through various processes including design process, wafer manufacturing process, wafer treating process, assembling process, and inspection process. In particular, in the wafer treating process and related processes, the wafer is treated in various processes, and then conveyed to the next process.

In the conventional semiconductor manufacturing apparatus, belt conveyance or robot conveyance was generally employed for conveying the wafers. In the belt conveying device, rubber or cloth belt is rotated and driven by a motor, and wafers are put on the belt and conveyed. This conveying device comprises a wafer feeding unit and a wafer conveying unit, and wafers are supplied into a reaction chamber for wafer treatment. The feeding unit is provided with a wafer cassette, and this wafer cassette is placed on a support table called a wafer loader. By lowering the support table, the wafers are put down one by one onto the conveying route composed of the belt, and set in the reaction chamber through the conveying route.

Whether in belt conveyance or in robot conveyance, contact between wafer and conveying device is inevitable, and dust may contact with the wafer or metal contamination occurs. As a result, the yield may be lowered in the processed products. Besides, since physical contact between the wafer and conveying device is inevitable, it is necessary to clean the robot arm or replace the conveying belt periodically and frequently, and the trouble in maintenance is not avoided.

Although the contact between wafer and conveying route is inevitable in the above conveying method, methods of conveying wafer without making contact between them are also known. One of them is the magnetic levitation conveying device for conveying the wafer levitated magnetically by a linear motor, and other one is a pneumatic levitation conveying device for levitating and propelling forward the wafer by ejecting air from obliquely below, by opening multiple pores in the conveying route.

Besides, in the reaction chamber of, for example, an conventional single wafer annealing apparatus of the type which anneals wafers one by one, heat treatment process is done. As the heat source, a lamp or the like is used, and forming of oxide film on wafer, impurity diffusion, glass flow of interlayer insulation film such as BPSG, compacting after CVD film deposition, silicide annealing, metal sintering, crystal defect process, and others are executed.

It is known well that the magnetic levitation conveying device utilizing the alternating-current electromagnet row is employed in wafer conveyance in semiconductor manufacturing apparatus. However, all proposals are used in the midst of conveying the wafer which is the object to be conveyed, and nothing is proposed about start of conveyance, delivery into the reaction chamber, or holding of wafer in the reaction chamber in the semiconductor manufacturing apparatus.

The conventional belt conveying device and other conveying device consist of wafer feeding unit and wafer conveying unit. Moreover, as mentioned above, the wafer feeding unit is provided with a wafer cassette, and the wafers are supplied one by one from the wafer cassette.

Figure 11:
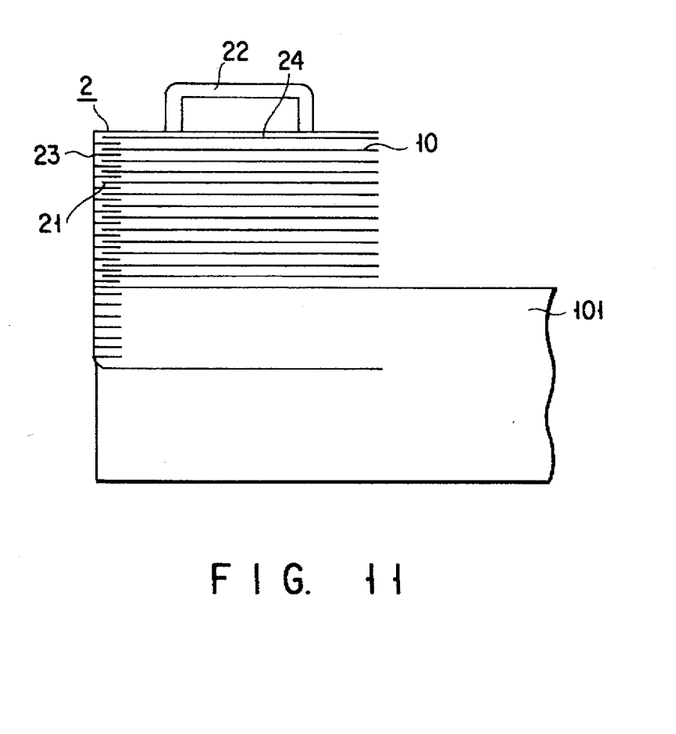
FIG. 11 is a side view of a conventional wafer conveying device.

FIG. 11 is a sectional view of a conventional wafer cassette 2. This wafer cassette 2 is cubic, and wafer racks 21 for holding wafers are provided in its three sides 23, and plural silicon wafers or other wafers 10 are stored on each rack. A handle 22 is attached to a top plate 24 of the wafer cassette 2 for the ease of carrying. The bottom of the wafer cassette 2 is opened. This wafer cassette 2 is attached to a wafer feeding unit of a belt type wafer conveying device 101. The wafer cassette 2 feeds the wafers 10 supplied in the wafer feeding unit one by one onto the conveying route driven by a belt. The wafer cassette 2 is set in position so as to carry up to the upper part of the wafer feeding unit by an elevator (not shown), so that the wafers 10 may be sequentially supplied into the conveying unit from the first one. As the wafers 10 are supplied, and the number of wafers 10 left over in the wafer cassette 2 decreases, the elevator is manipulated to correct the position of the wafer cassette 2. This correction can be automated by position sensor or the like. The belt type conveying route gets inside of the wafer cassette 2 from the bottom opening as the number of wafers decreases in the wafer cassette 2.

In the conventional belt type wafer conveying device, when the wafer contacts with the wafer conveying unit, dust or metal contamination occurs, and the product yield may be lowered. Besides, the troublesome maintenance cannot be avoided because replacement of conveying belt or other servicing is done periodically and frequently. To avoid such trouble, the magnetic levitation conveying device is developed as mentioned above. However, to use the magnetic levitation conveying device in wafer conveyance, a problem occurs between the feeding unit and conveying unit.

When the magnetic levitation conveying device is used, to send out the wafer onto the conveying route, the alternating-current electromagnetic row serving as the conveying route must be positioned immediately beneath the wafer cassette. Usually, the interval of adjacent wafers accommodated in the wafer cassette is about 1 cm or less. At such interval, when the electromagnets immediately beneath the wafer cassette is moved, if attempted to supply the lowest one in the wafer cassette, that is, the first one to be supplied into the conveying route, the next and third or further wafers may be levitated at the same time, and several wafers may be conveyed in overlaid state. To avoid this, it may be considered to use the conventional belt conveyance or robot arm only for the action of taking out the wafers one by one from the wafer cassette, but contamination or dust may occur due to contact with the wafer back side, and the product yield may be lowered significantly.

On the other hand, in the conventional semiconductor manufacturing apparatus for heating and oxidizing the wafers, it is necessary to hold the wafers during heating treatment by using a jig for holding the wafers. However, to prevent impurity contamination, quartz or other insulating material is used in the reaction chamber and others, but this material is hard to process, and is fragile.

Besides, in principle, it is impossible to avoid physical contact of these jigs with the wafers, and they must be replaced depending on the degree of wear after using many times. Accordingly, due to shutdown for such servicing, the operation rate of the manufacturing apparatus is lowered. Moreover, in the case of such physical contact between the wafer and jig, since the temperature differs between the portion contacting with the jig and the other portion not contacting, and it may cause to disturb the uniformity of heating temperature of wafer.

SUMMARY OF THE INVENTION

It is a first object of the invention to present a semiconductor manufacturing apparatus employing a magnetic levitation wafer conveying device capable of preventing the wafer waiting in the wafer cassette from popping out of the wafer cassette, when a wafer is transferred into a wafer conveying route.

It is a second object of the invention to present a semiconductor manufacturing apparatus having a reaction chamber for avoiding physical contact between the jig and a wafer supplied from the magnetic levitation wafer conveying device.

It is a third object of the invention to present a semiconductor manufacturing apparatus capable of supporting and heating in a reaction chamber without allowing physical contact between the wafer and jig.

The above objects of the invention are achieved by the following constitution.

The invention is characterized by disposing a wafer stopper for preventing the wafer waiting in the wafer cassette from popping outside, on the front face a wafer cassette provided in a wafer feeding unit of a magnetic levitation wafer conveying device. The wafer taken out from the magnetic levitation wafer conveying device is supplied into the reaction chamber by magnetic force, and is directly held in the reaction chamber by the magnetic force. It is also characterized by supporting and heating in the reaction chamber by magnetic levitation so that the wafer and jig may not contact with each other physically. Besides, at least upper side and lower side of the reaction chamber for supporting the wafer by magnetic levitation are formed of a nonmagnetic piece made of nonconductive material. It is a first aspect of the invention to present a semiconductor manufacturing apparatus comprising a wafer feeding unit having a wafer cassette for accommodating plural wafers, a wafer conveying unit having one end connected to the wafer feeding unit, and possessing an alternating-current electromagnet row composed of plural alternating-current electromagnets for levitating the wafers by repulsive force or suction force of magnetism, a reaction chamber connected to other end of the wafer conveying unit for heating the wafers, and a wafer stopper fixed between the wafer feeding unit and conveying starting end of the wafer conveying unit, in which the wafer stopper is characterized by preventing other wafers than the wafer to be conveyed from being sent out together with the wafer to be conveyed to the wafer conveying unit.

The plural alternating-current electromagnets may be provided in the wafer feeding unit and reaction chamber. The wafer stopper is made of a plate material, and a slit for passing the wafer may be formed in this plate material. The plural alternating-current electromagnets in the reaction chamber generate a magnetic flux which changes with the time by an alternating-current power source, and the wafer is supported in a contact-free state by a repulsive force acting between the electromagnet and the wafer conveyed from the conveying unit, and at the same time the wafer is heated by making use of an eddy current generated in the wafer by the magnetic flux changing with the time. In the reaction chamber, auxiliary heating means composed of either high frequency heating means or infrared heating means may be formed. A second aspect of the invention may comprise a reaction chamber for heating wafers, and a plurality of alternating-current electromagnets attached to the portion of the reaction chamber, in which the plural alternating-current electromagnets generate a magnetic flux which changes with the time by an alternating-current power source, and the wafer is held in the reaction chamber without making contact therewith by the repulsive force acting between the electromagnet and the wafer, and the wafer is heated by making use of an eddy current generated in the wafer by the magnetic flux changing with the time. The reaction chamber may also comprise auxiliary heating means composed of either high frequency heating means or infrared heating means, or control means for adjusting the output of the plural alternating-current electromagnets.

The wafer stopper is disposed between the wafer cassette fitted in the wafer feeding unit and the starting end of the wafer conveying route. Therefore, the wafer waiting in the wafer cassette other than the wafer to be conveyed is prevented from popping out together with this wafer to be conveyed. Moreover, the wafer conveyed by the magnetic force can be supported by magnetic force in the reaction chamber, so that it may be heated. Since the material of the reaction chamber is a nonmagnetic piece made of nonconductive material, the reaction chamber is free from effects of magnetic field, so that the wafer may be disposed precisely at specified position. In this way, since the wafer is conveyed and supported in the reaction chamber by making use of the magnetic levitation force, the back side of the wafer does not contact physically with others. Therefore, effects of impurity contamination and dust on the wafer decrease dramatically. Moreover, the jig for supporting the wafer in the reaction chamber is not needed, and direct wafer contamination from the jig and wear of jig may be prevented. Still more, since the wafer does not contact directly with the jig, the temperature profile and temperature difference between the area of jig and other area may be minimized. Therefore, the impurity concentration profile in the wafer and oxide film thickness may be made uniform.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Referring now to the drawings, some of the embodiments of the invention are described below.

Figure 1:
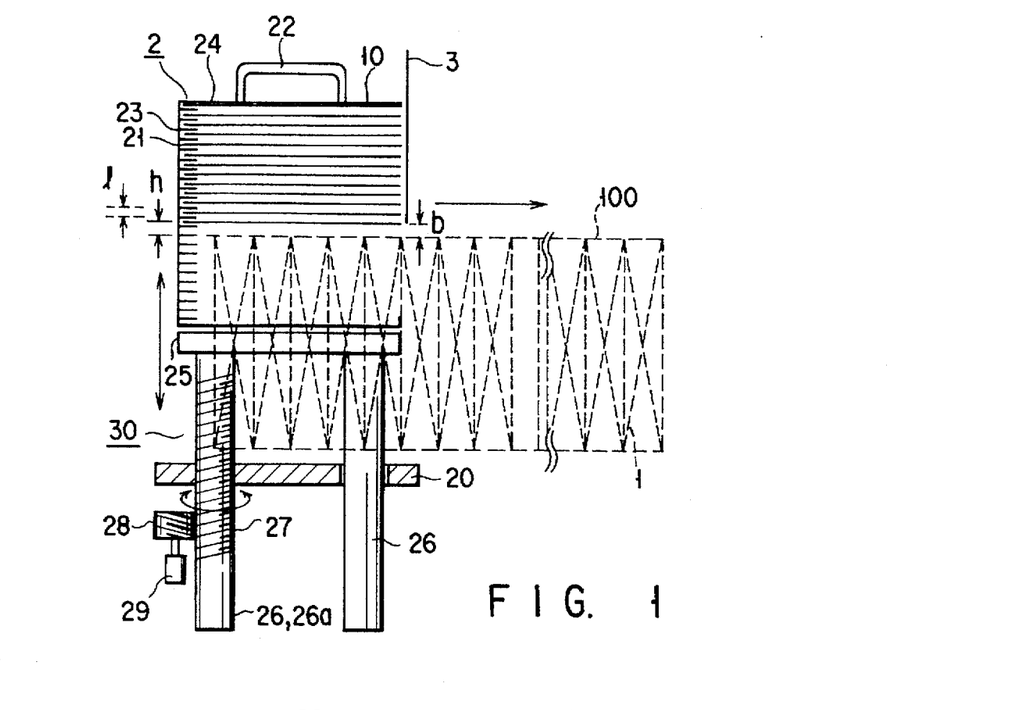
FIG. 1 is a sectional view showing a part of a magnetic levitation conveying device in a first embodiment of the invention.
Figure 2:
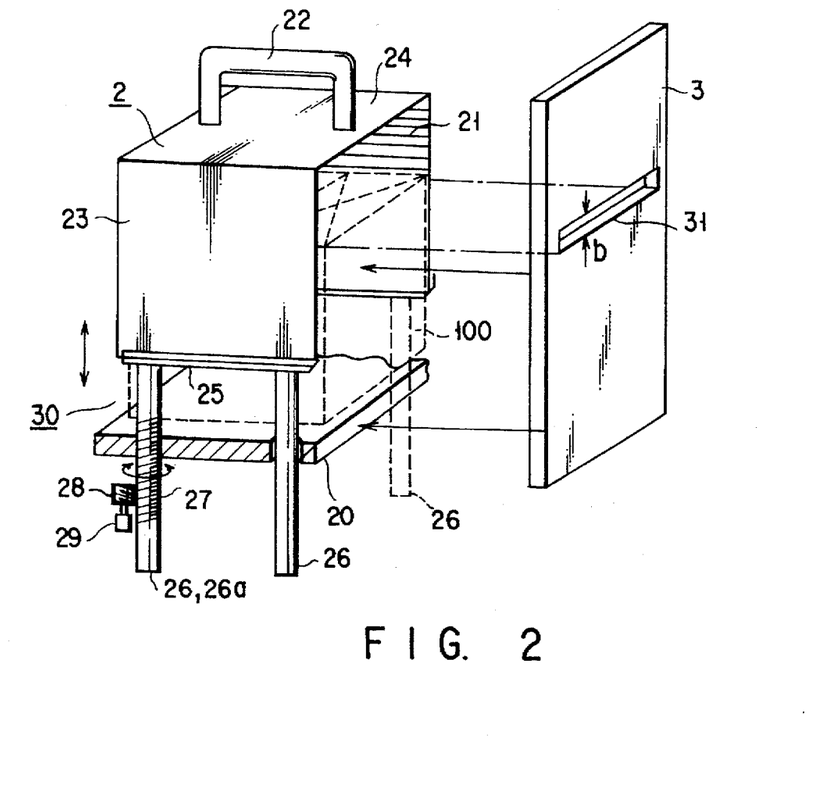
FIG. 2 is a perspective view showing part of the magnetic levitation conveying device in the first embodiment.

First referring to FIG. 1 and FIG. 2, a first embodiment of the invention is described below. FIG. 1 is a sectional view showing part of the semiconductor manufacturing apparatus, and FIG. 2 is its perspective view. The semiconductor manufacturing device comprises a magnetic levitation conveying device for conveying wafers, and a heat treatment device comprising a reaction chamber for heating and oxidizing the wafers supplied from the conveying device. The magnetic levitation conveying device comprises a wafer feeding unit having a wafer cassette, and a wafer conveying unit having a wafer conveying route. FIG. 1 and FIG. 2 show part of the wafer conveying route and wafer feeding unit. In the wafer feeding unit, one end of an alternating-current electromagnet row 100 arraying plural alternating-current electromagnets 1 is provided, and there is also a support element 20 for supporting and moving a wafer cassette 2. In this support element 20, plural penetration holes are provided, and a threaded groove is formed inside of one of these penetration holes. Support rods 26 are inserted in these penetration holes, and on the surface of the support rod 26a in the penetration hole in which the threaded groove is formed, out of these support rods 26, a threaded groove 27 to be engaged with the threaded groove is formed.

A gear 28 is engaged with the threaded groove 27, and this gear 28 is fitted to the shaft of the motor 29. When the motor 29 is driven, the support rod 26a is put in rotation through the gear 28, and the support rod 26a moves to the support element 20. At the front end of each support rod 26, a support base 25 called a wafer loader is attached. The support rod 26a is rotatably mounted on the support base 25.

The wafer cassette 2 is set on this support base 25, and is moved up and down as being driven by the motor 29. Therefore, the support base 25, support rod 26 and motor 29 compose an elevator 30. The elevator 30 moves the wafer cassette 2 in the vertical direction, perpendicular to the moving direction of the wafer conveying route. The wafer cassette 2 makes use of the magnetic levitation force also when taking out the wafer from inside of the cassette. Hence, the elevator 30 is disposed, straddling on one side of the alternating-current electromagnet row 100.

The wafer cassette 2 is cubic, and wafer racks 21 for holding wafers are provided on its three sides 23, and plural silicon wafers and other wafers 10 are accommodated on each rack. A handle 22 is attached to a top plate 24 of the wafer cassette 2 for the ease of carrying. The bottom of the wafer cassette 2 is opened, so that the alternating-current magnet row 100 may invade inside from the bottom. The opened side of the wafer cassette 2 is a wafer take-out side, and this opened side is directed to the conveying direction. The wafer cassette 2 supplies the wafers 10 supplied in the wafer feeding unit, one by one onto the wafer conveying route. First, the wafer cassette 2 carries to the upper part of the wafer feeding unit by the elevator, and is set in position so that the first one may be supplied into the wafer conveying route.

From the first one, the wafers 10 are sequentially supplied into the feeding unit. As the wafers 10 are supplied, and the number of wafers 10 left over in the wafer cassette 2 decreases, the elevator 30 is manipulated to correct the position of the wafer cassette 2. This correction can be automated by position sensor or the like. As the number of wafers 10 in the wafer cassette 2 decreases, the alternating-current electromagnet row 100 gets into the half cassette 2 from the bottom opening.

It is a feature of this invention that the wafer stopper 3 is provided at the front side of the wafer take-out side of the opened side surface of the wafer cassette 2. In this embodiment, in particular, the wafer stopper 3 is fixed on the support element 20 (see FIG. 2). Since the wafer stopper 3 is used by fixing, it is fixed at a specified position of the semiconductor manufacturing apparatus. It may be also fixed at a proper position of the alternating-current electromagnet row 100. A slit (opening) 31 is formed in the wafer stopper 3, and the bottom of the slit 31 coincides with the top surface of the alternating-current electromagnets 1. It is designed that one wafer 10 can pass through the slit 31 disposed when the wafer stopper 3 is attached to the support element 20, and therefore the width b and length of the slit 31 are set larger than the diameter and thickness of the wafers 10.

The role of the wafer stopper is to prevent the wafers other than the one wafer to pass through the slit from popping out into the wafer conveying route, and therefore the portion responsible for the action as stopper is above the upper part of the slit. Strictly speaking, the height b of the upper end of the slit 31 when the lower end (bottom) of the slit 31 is adjusted to the upper surface of the alternating-current electromagnets 1 must be higher than the floating height h of the wafers 10. Moreover, the upper end of the slit 31 should come to a position lower than the wafer at the second position from the bottom, that is, the height b of the upper end of the slit 31 must be smaller than the sum (h+1) of the wafer interval 1 and wafer floating height h.

Due to the presence of the wafer stopper, the wafers can be supplied one by one accurately into the wafer feeding unit. The wafer stopper is composed of synthetic resin plate or quarts material, and is small in generation of impurities.

Figure 3:
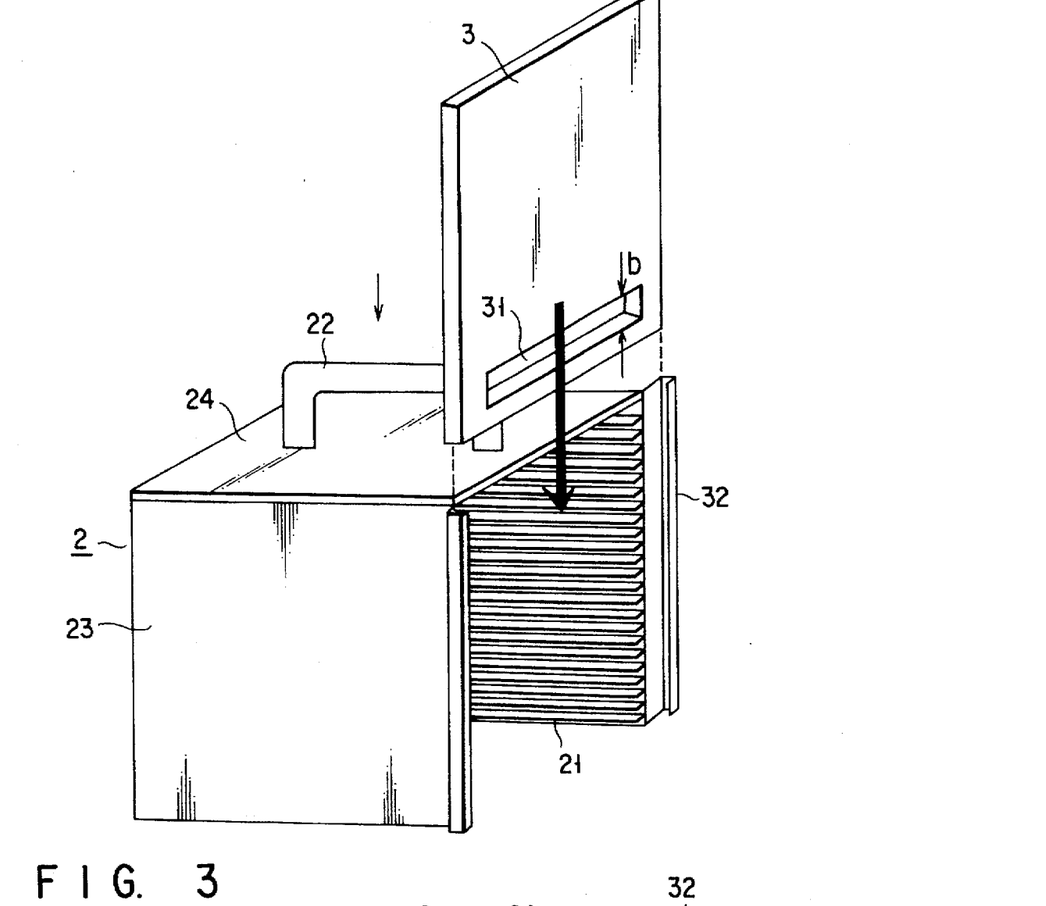
FIG. 3 is a perspective view of a wafer cassette in a second embodiment.
Figure 4:
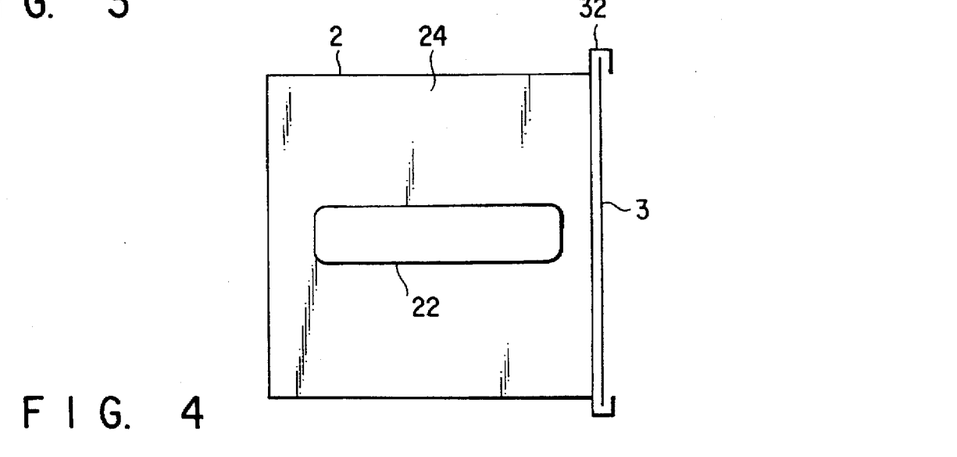
FIG. 4 is a plan view seen from the top of the wafer cassette in FIG. 3.

Referring next to FIG. 3 and FIG. 4, a second embodiment of the invention is described below.

FIG. 3 is a perspective view of wafer cassette and wafer stopper of a magnetic levitation conveying device of the embodiment, and FIG. 4 is a top view of the same wafer cassette and wafer stopper. The semiconductor manufacturing apparatus of the invention comprises, same as in the previous embodiment, the magnetic levitation conveying device for conveying wafers, and heat treating device having a reaction chamber for heating and oxidizing the wafers supplied from the conveying device. The magnetic levitation conveying device comprises a wafer feeding unit having a wafer cassette, and a wafer conveying unit having a wafer conveying route.

The wafer cassette 2 is cubic, and wafer racks 21 for accommodating wafers are provided in its three sides 23, and plural silicon wafers or other wafers are accommodated on each rack. A handle 22 is attached to a top plate 24 of the wafer cassette 2 for the ease of carrying. The bottom of the wafer cassette 2 is opened, so that the alternating-current magnet row may invade inside from the bottom. The opened side of the wafer cassette 2 is a wafer take-out side, and this opened side is directed to the conveying direction. Grooves 32 are provided at both sides of the opened side, where the wafer stopper 3 is designed to slide.

The wafer cassette 2 is supplied into the wafer feeding unit, and the wafers are supplied one by one into the wafer conveying route. First, the wafer cassette 2 is carried onto the upper part of the wafer feeding unit by the elevator, and its position is set so that the first one may be supplied into the wafer conveying unit. The wafers are then sequentially supplied from the first one into the conveying unit. As the wafers are supplied, and the number of wafers left over in the wafer cassette 2 decreases, the elevator is manipulated, and the position of the wafer cassette 2 is corrected automatically.

In the first embodiment, the wafer cassette 2 and wafer stopper 3 were separate, but in this embodiment, the wafer stopper 3 is fixed, for example, to the support element 20 shown in FIG. 2. In this state, the wafer stopper 3 moves along a groove 32 formed on both sides of the wafer cassette 2, and hence it may be regarded nearly identical to the wafer cassette 2. A slit (opening) 31 is formed in the wafer stopper 3, and the bottom of the slit 31 coincides with the top surface of the alternating-current electromagnets 1. It is designed so that one wafer may pass through the slit 31 positioned when the wafer stopper 3 is attached to the support element 20, and hence the width b and length of the slit 31 is set larger than the diameter and thickness of the wafer.

The role of the wafer stopper is to prevent other wafers than the wafer to pass through the slit from popping out into the wafer conveying route, and hence the portion responsible for action as the stopper is above the upper part of the slit. That is, when the lower end (bottom) of the slit 31 is adjusted to the upper surface of the alternating-current electromagnet row, the height b of the upper end of the slit 31 must be higher than the wafer floating height, and the upper end of the stopper 31 must come to the position lower than the second wafer from the bottom.

In this way, since the wafer stopper 3 moves along the groove 32 attached to the wafer cassette 2, slight fluctuations of the wafer cassette 2 are rare, and the wafers are supplied accurately. It should be noted the wafer stopper 3 need not be fixed to the support element 2.

A third embodiment of the invention is described below while referring to FIG. 5 and FIG. 6.

Figure 5:
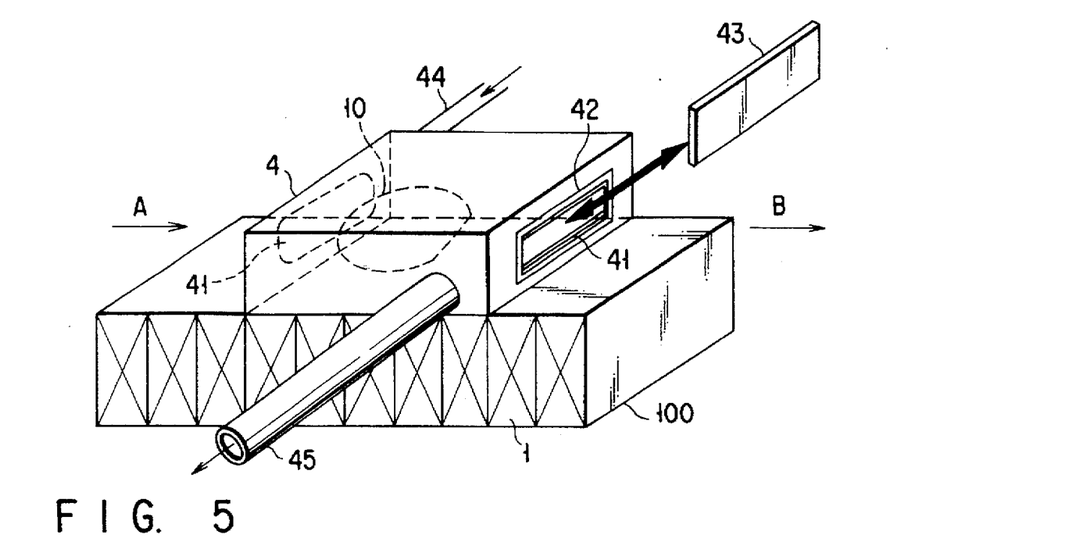
FIG. 5 is a perspective view of a heat treating device in a third embodiment.
Figure 6:
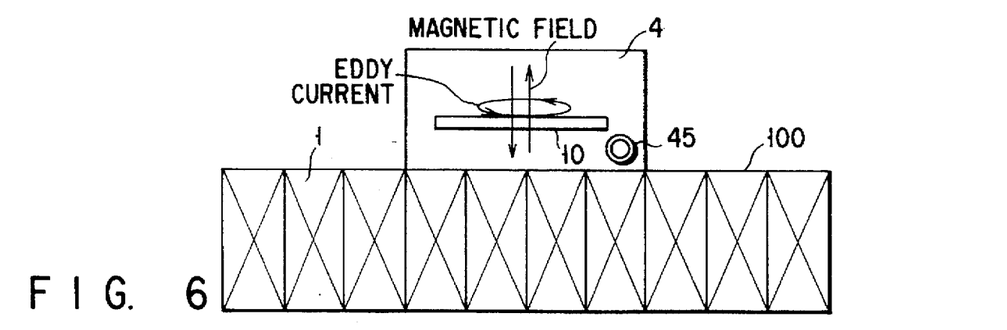
FIG. 6 is a side view of the heat treating device in the third embodiment.

FIG. 5 is a perspective view of the heat treating device, and FIG. 6 is a side view of the heat treating device in FIG. 5 as seen from the front side. This heat treating device is connected and integrated in the magnetic levitation conveying device shown in FIG. 1, and holds and heats the wafers supplied from the conveying device. By using other conveying means, wafers may be also brought into the heat treating device and heated.

The heat treating device comprises an alternating-current electromagnet row 100 for conveying wafers by magnetic levitation, and a reaction chamber 4 covered with high purity quartz disposed thereon. The wafer 10 is sent into the reaction chamber 4 while being levitated magnetically through the conveying route composed by the alternating-current electromagnetic row 100, and are heated there and conveyed to the next process. The reaction chamber 4 has a gate opening 41 for accepting a wafer 10 being levitated and conveyed. The gate opening 41 is to be opened and closed by the gate valve 43, and while the wafer 10 is being mounted and heated in the reaction chamber 4, the gate valve 43 is closed, and the reaction chamber 4 is enclosed. To enhance the air tightness, a rubber O-ring 42 is formed around the gate opening 41. In the drawing, the wafer 10 enters from direction A, and is discharged from direction B. The gate opening 41 is identical in structure at both inlet and outlet. The reaction chamber 4 has an intake pipe 44 for receiving inert gas such as $N_2$ and He, and an exhaust pipe 45 for discharging the exhaust gas after heat treatment.

In the invention, as in this embodiment, the reaction chamber 4 is put on the alternating-current electromagnet row 100. Therefore, when the wafer 10 is carried into the reaction chamber, the wafer 10 levitated and held as it is by the magnetic force.

The alternating-current magnetic field for levitating magnetically the wafer in this way generates Joule heat, by the generated eddy current I and resistance R of the wafer itself, as shown in formula (1):

$$W = RI^2 \tag{1}$$

The wafer 10, by this heat, undergoes heat treatment for diffusion of impurity, or heat treatment for forming an thermal oxide film on the surface. The heat treatment condition may be easily determined by properly setting the flow rate of the supplied inert gas, voltage applied to the alternating-current electromagnet, and the passing current at specified values.

In this way, in the reaction chamber 4, the wafer is levitated and held by the magnetic levitation force by the alternating-current electromagnets, and heated with the Joule heat generated by the eddy current generated in the wafer and the resistance of the wafer during magnetic levitation. In heat treatment such as annealing at multiple stages of temperature, the heat treatment condition is varied by setting the flow rate of the inert gas, voltage applied to the alternating-current electromagnet, and passing current value to specified value.

Therefore, since there is not jig for holding the wafer in the reaction chamber, direct contamination of wafer from the jig and wear of jig may be prevented. Since the wafer does not contact directly with the jig, temperature profile and temperature difference of the jig area and other parts can be minimized. Therefore, the impurity concentration profile and oxide film thickness may be uniform in the wafer.

Figure 7:
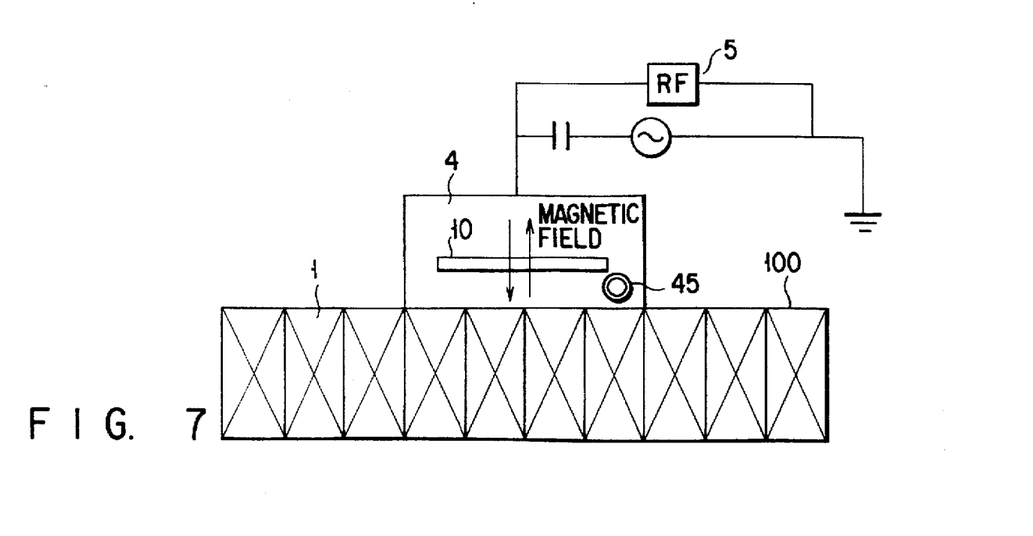
FIG. 7 is a side view of a heat treating device in a fourth embodiment.

Referring next to FIG. 7, a fourth embodiment of the invention is described below.

FIG. 7 is a side view of a heat treating device. This heat treating device is connected and integrated to the magnetic levitation conveying device shown in the preceding embodiment, and holds and heats the wafer sent from this conveying device. This heat treating device is constituted by adding a radio frequency heating device as auxiliary heating means to the heat treating device in the third embodiment. Moreover, by using other conveying means, the wafer may be brought into the heat treating device, and be heated.

In the third embodiment, in order to hold the wafer at a specified height, the voltage and current applied to the alternating-current electromagnets cannot be changed so much. It is hence possible that the degree of freedom of the temperature control may be limited. In this embodiment, therefore, the degree of freedom of temperature control is expanded by combining with other heating means.

That is, in this embodiment, the voltage, current, and frequency applied to the alternating-current electromagnets 1 are kept constant, and a radio frequency signal is applied from a radio frequency oscillator (RF) to the wafer through an electrode (not shown) provided in the upper part of the reaction chamber 4. By properly changing the frequency of this signal, the heating to the wafer is controlled.

In this embodiment, by levitating and holding the wafer by the magnetic levitation force by the alternating-current electromagnets, heat treatment is executed by the Joule heat generated by the eddy current generated in the wafer during magnetic levitation and the resistance of the wafer itself, and radio frequency heating. Therefore, since there is no jig for supporting the wafer in the reaction chamber, direct wafer contamination from the jig and wear of jig can be prevented. Moreover, since the wafer does not contact directly with the jig, the temperature profile and temperature difference between the jig area and other area can be minimized. Therefore, the impurity concentration profile in the wafer and oxide film can be made uniform. Still more, by the flow rate of the supplied gas and frequency of the auxiliary heating means, the heating condition can be set easily such as annealing at multiple stages of temperature.

Figure 8:
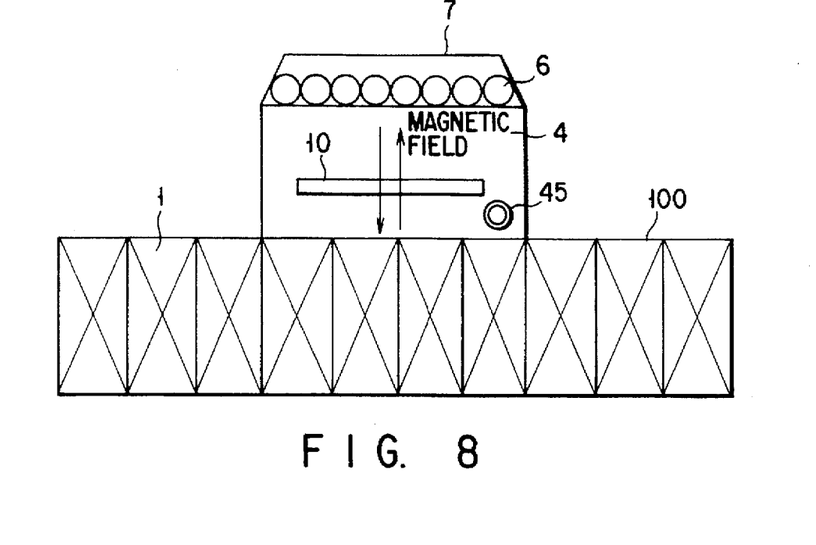
FIG. 8 is a side view of a heat treating device in a fifth embodiment.

Referring now to FIG. 8, a fifth embodiment of the invention is described below.

The diagram is a side view of a heat treating device. This heat treating device is connected and integrated to the magnetic levitation conveying device in the foregoing embodiment, and is designed to hold and heat the wafer sent from this conveying device. Or, by using other conveying means, the wafers may be brought in and heated in the heat treating device. In this embodiment, same as in the fourth embodiment, the degree of freedom of temperature control can be expanded by combining with other heating means. In this embodiment, keeping constant the voltage, current and frequency applied to the alternating-current electromagnets 1, the wafer is heated by heat, for example, infrared ray from plural halogen lamps 6 provided in the upper part of the reaction chamber 4. By varying the output of the halogen lamps 6, the wafer temperature is controlled. A reflector 7 is provided in the reaction chamber 4 so as to utilize the lamp output efficiently.

This heat treating device is constituted by adding the halogen lamps 6 and reflector 7 to the heat treating device in the third embodiment. In this embodiment, the wafer is levitated and held by the magnetic levitation force by the alternating-current electromagnets, and heat treatment is executed by the Joule heat generated by the eddy current generated in the wafer at the time of magnetic levitation and the the resistance of the wafer itself, and infrared ray generated by the halogen lamps 6.

Therefore, since there is no jig for holding the wafer in the reaction chamber, direct wafer contamination from the jig and wear of jig can be prevented. Moreover, since there is no direct contact between the wafer and jig, the temperature profile and temperature difference between the jig area and other area can be minimized. Therefore, the impurity concentration profile and oxide film thickness in the wafer surface can be made uniform. Besides, the heating condition of the wafer can be set easily by the flow rate of the supplied gas and halogen lamp as auxiliary heating means.

In the third to fifth embodiments, by the use of reinforce glass and other nonmagnetic material and nonconductive material in the reaction chamber, it is effective to prevent magnetization of wall of reaction chamber or formation of eddy current on the reaction chamber wall, and the parasitic magnetic field created by eddy current is prevented from affecting the magnetic field created by the alternating-current electromagnet. Moreover, to minimize the effects of parasitic magnetic field and to maintain the strength of the reaction chamber, only the plane vertical to the conveying route composed of alternating-current electromagnet row may be composed of nonmagnetic metal such as Al, or the upper and lower planes of the reaction chamber may be formed of nonmagnetic material or nonconductive material such as reinforced glass. In the surrounding of the gate opening, a groove for burying an O-ring in the reaction chamber may be formed, and by fitting the O-ring therein, the tightness of the gate opening and gate valve may be enhanced. The gate valve is opened or closed by moving parallel vertically or laterally. The pipe for taking in gas and the pipe for emitting exhaust gas are formed on a different side from the gate valve forming side.

Figure 9:
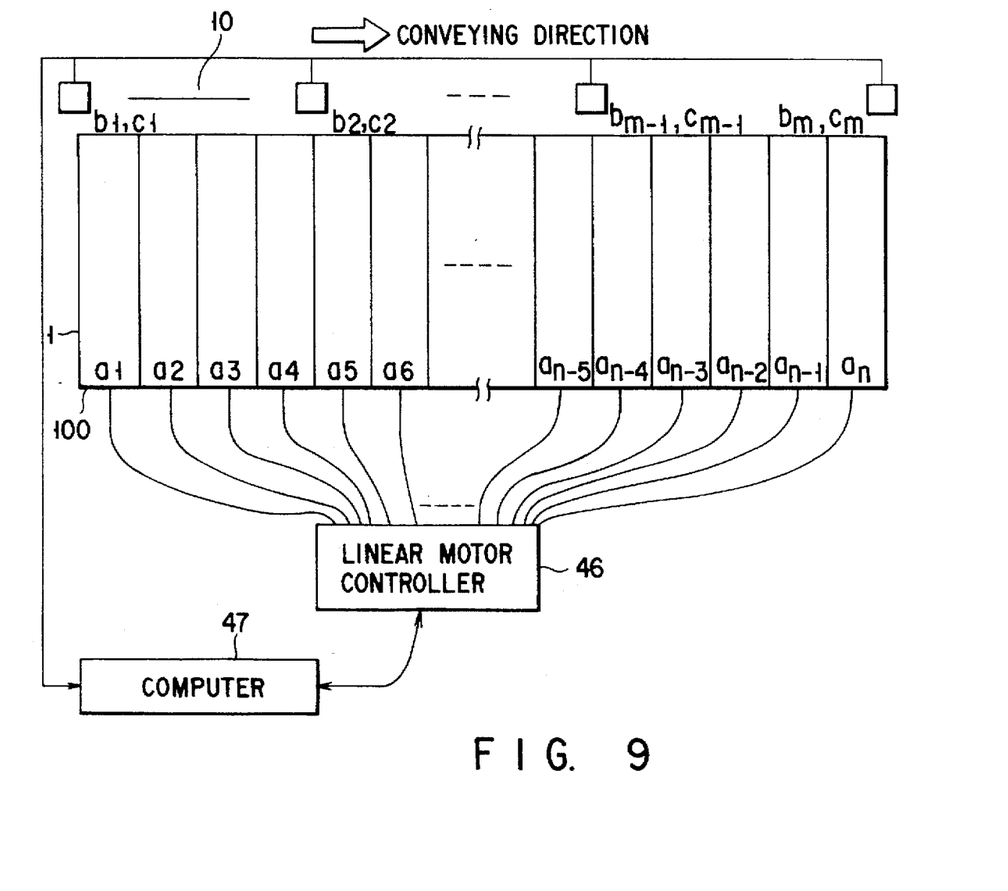
FIG. 9 is a sectional view of conveying system of the invention.
Figure 10:
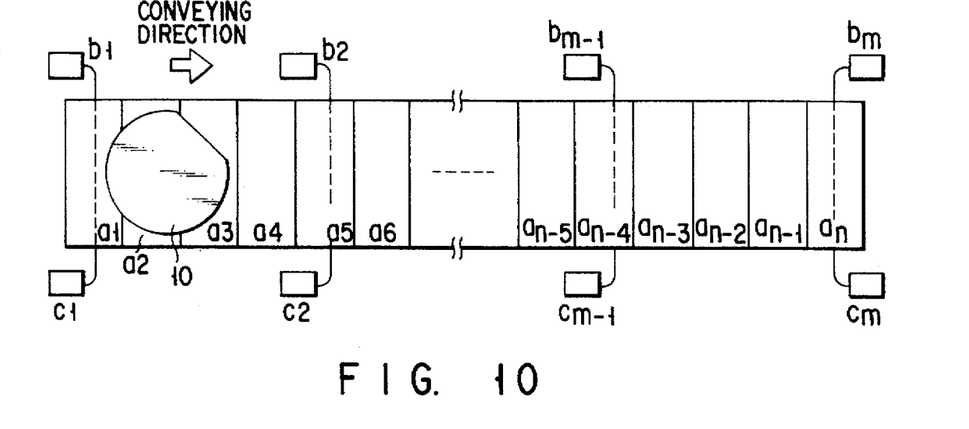
FIG. 10 is a plan view of the conveying system of the invention.

Referring to FIG. 9 and FIG. 10, the conveying system for conveying wafers in the magnetic levitation conveying device of the semiconductor manufacturing apparatus of the invention is described. FIG. 9 is a schematic sectional view of the wafer conveying system, and FIG. 10 is its plan view. The conveying system is composed of the alternating-current electromagnet row 100 composed of n alternating-current electromagnets (a1, a2, a3, ..., an) 1. Hereinafter, this alternating-current electromagnet row is called a linear motor. Above the linear motor 100, m height sensors (b1, b2, b3, ..., cm) for detecting the wafer levitation height from the linear motor top surface, and m position sensors (c1, c2, c3, ..., cm) for detecting the conveying speed of wafers 10 are disposed in pairs. Each alternating-current electromagnet is connected to a linear motor controller 46 for controlling the linear motor. The height and position sensors and the linear motor controller 46 are connected to a computer 47. The computer 47 receives a signal from the linear motor controller 46 and signals from the height and position sensors, and sends out current and voltage signals for adjusting the height and conveying speed of wafers 10 to the linear motor controller 46. In this constitution, the wafers can be conveyed at specified speed and height. In particular, passing through the gate opening can be easily controlled.

The supporting conditions in the air of the wafer by the electromagnets disposed in the conveying device and reaction chamber are described below.

By the magnetic flux changing with the time of penetrating through the wafer, an electromotive force is generated in the wafer, and this electromotive force causes eddy current to flow in all parts of the wafers. At this time, the magnetic field penetrating through the wafer acts on the eddy current, and applies force to the wafer. From the relation between the magnetic flux $\Phi$ ($=\Phi_0\sin\omega t$) changing with the time of penetration through the wafer at this time and the force ($F_{ex}$) applied to the wafer, the action of the wafer is described below. Suppose the electromagnet for generating magnetic field is sufficiently larger than the wafer area (S), and that the magnetic flux ($\Phi$) penetrating through the wafer is uniform regardless of the place. When the magnetic flux ($\Phi$) generated by the electromagnet penetrates through the wafer, an inductive electromotive force $V_0$ ($=-\omega\Phi_0\cos\omega t$) is generated in the wafer. At this time, the eddy current $I_e$ generated in the region of radius d in the wafer area of the wafer of which volume resistivity is $\rho$ is $-(a^2\omega\Phi_0/\rho\cdot 2\pi d)\cos\omega t$ (a being a constant). Therefore, by interaction with external magnetic field B ($=\Phi/S$), supposing the force applied to this eddy current to be $f_{ex}$, force $F_{ex}$ ($=Sf_{ex}/\pi d^2$) applied to the entire wafer is $-(a^2\omega\Phi^2/\mu\cdot 4\pi^2 d^3)\sin\omega t$). Supposing the mass of the wafer per unit area to be $\sigma$ [kg/m$^2$], the mass M of the entire wafer is expressed as $S\sigma$. Assuming this wafer is supported at a height of z on the electromagnet, it follows that $z=z_0+A_0\sin 2\omega t(A_0=a^2\Phi_0^2/\ 16M\mu\cdot\pi^2 d^3\omega)$. In other words, the wafer makes a monotonous vibration vertically in a margin of $A_0$ around the height $z_0$. In order that the wafer be always levitated regardless of this monotonous vibration in the vertical direction, the center of vibration must be greater than this amplitude. Therefore it requires $A_0>z_0$, and the wafer oscillates slightly at a height of $z_0$, and in order to maintain this height, the required condition of the magnetic flux $\Phi_0$ is $!!|\Phi_o|>a/4\pi(z_0/M\rho\cdot d^3\omega)^{1/2}$.

What is claimed is:

1. A semiconductor manufacturing apparatus comprising:
   a wafer feeding unit having a wafer cassette for storing a plurality of wafers, the wafer cassette further including an opening through which the plurality of wafers are removed;
   a wafer stopper for allowing only one wafer to be removed at a time through the opening of the wafer cassette;

a wafer conveying unit having a row of alternating-current electromagnets for levitating the wafers to remove a wafer from the wafer cassette through the opening of the wafer cassette and the wafer stopper, and for conveying the removed wafer; and a reaction chamber for receiving the conveyed wafer and for heating the received wafer.

2. A semiconductor manufacturing apparatus according to claim 1, wherein said wafer feeding unit and said reaction chamber further include a plurality of alternating-current electromagnets.

3. A semiconductor manufacturing apparatus according to claim 1, wherein said wafer stopper comprises a plate having a slit for passing said wafer.

4. A semiconductor manufacturing apparatus according to claim 1, wherein said plurality of alternating-current electromagnets of said reaction chamber generate a magnetic flux that changes over time according to an alternating-current power source, such that the wafer is levitated by the magnetic force of the plurality of electromagnets and wherein the wafer is heated by an eddy current generated in the wafer by said changing magnetic flux.

5. A semiconductor manufacturing apparatus according to claim 4, further comprising auxiliary heating means connected to said reaction chamber, for heating said wafer conveyed into the reaction chamber.

6. A semiconductor manufacturing apparatus according to claim 5, wherein said auxiliary heating means comprises high frequency heating apparatus.

7. A semiconductor manufacturing apparatus according to claim 5, wherein said auxiliary heating means comprises an infrared heating apparatus.

* * * * *